(12) United States Patent
Kim et al.

(10) Patent No.: US 9,192,067 B2
(45) Date of Patent: Nov. 17, 2015

(54) DOCKING STATION

(71) Applicant: Samsung Electronics Co. Ltd., Suwon-si, Gyeonggi-do (KR)

(72) Inventors: Jong-Hae Kim, Gwangmyeong-si (KR); Won-Tae Kim, Hwaseong-si (KR); Ji-Hoon Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 31 days.

(21) Appl. No.: 13/966,976

(22) Filed: Aug. 14, 2013

(65) Prior Publication Data
US 2014/0063703 A1 Mar. 6, 2014

(30) Foreign Application Priority Data
Aug. 28, 2012 (KR) .................. 10-2012-0094161

(51) Int. Cl.
| | |
|---|---|
| G06F 1/16 | (2006.01) |
| H05K 5/00 | (2006.01) |
| H05K 7/00 | (2006.01) |
| H05K 7/02 | (2006.01) |

(52) U.S. Cl.
CPC ............... *H05K 7/02* (2013.01); *G06F 1/1632* (2013.01)

(58) Field of Classification Search
None
See application file for complete search history.

(56) References Cited

U.S. PATENT DOCUMENTS

| | | | |
|---|---|---|---|
| 5,144,290 A * | 9/1992 | Honda et al. ................ 345/156 |
| 6,366,450 B1 | 4/2002 | Janicek | |
| 6,898,080 B2 * | 5/2005 | Yin et al. ................. 361/679.41 |
| 7,643,283 B2 * | 1/2010 | Jubelirer et al. ......... 361/679.41 |
| 7,817,414 B2 * | 10/2010 | Chou et al. .............. 361/679.41 |
| 8,042,957 B2 * | 10/2011 | Li .................................. 353/119 |
| 8,159,818 B2 * | 4/2012 | Riddiford ................ 361/679.41 |
| 8,498,109 B2 * | 7/2013 | Nishimoto .............. 361/679.41 |
| 2002/0032041 A1 | 3/2002 | Hirai et al. |
| 2005/0265569 A1 * | 12/2005 | Langberg et al. ............. 381/334 |
| 2005/0287852 A1 | 12/2005 | Sugawara et al. |
| 2006/0104018 A1 * | 5/2006 | Tracy et al. ................... 361/683 |
| 2006/0250764 A1 * | 11/2006 | Howarth et al. .............. 361/683 |
| 2007/0073952 A1 * | 3/2007 | Tsai et al. ..................... 710/303 |
| 2008/0067977 A1 | 3/2008 | Lee et al. |
| 2008/0089547 A1 * | 4/2008 | Young et al. .................. 381/386 |
| 2008/0239658 A1 * | 10/2008 | Chou et al. ................... 361/686 |
| 2009/0009957 A1 * | 1/2009 | Crooijmans et al. ......... 361/686 |
| 2009/0097192 A1 | 4/2009 | Riddiford |
| 2010/0062615 A1 * | 3/2010 | Prest .............................. 439/38 |

(Continued)

FOREIGN PATENT DOCUMENTS

| | | |
|---|---|---|
| JP | 2003-198699 A | 7/2003 |
| KR | 10-2002-0025326 A | 4/2002 |

(Continued)

*Primary Examiner* — Hoa C Nguyen
*Assistant Examiner* — Xanthia C Cunningham
(74) *Attorney, Agent, or Firm* — Jefferson IP Law, LLP (57) ABSTRACT

A docking station for an electronic device is provided. The docking station includes a housing having an inner space, a rotator disposed in a rotatable manner inside the housing, and partially exposed outwardly to the housing when completely open, a movable member coupled to the rotator, and exposed together with a device mounting groove for mounting an electronic device thereon when the rotator is completely open, and a stopper coupled to the movable member to selectively control the movable member so that a position of the movable member is fixed when the rotator is completely open and so that the movable member moves in a closing direction together when the rotator is closed.

18 Claims, 8 Drawing Sheets

(56) References Cited

U.S. PATENT DOCUMENTS

| | | | |
|---|---|---|---|
| 2010/0149748 A1* | 6/2010 | Lam | 361/679.41 |
| 2010/0188808 A1* | 7/2010 | Howarth et al. | 361/679.41 |
| 2011/0028189 A1 | 2/2011 | Lin | |
| 2011/0043984 A1 | 2/2011 | Byrne | |
| 2012/0275092 A1* | 11/2012 | Zhou | 361/679.01 |

FOREIGN PATENT DOCUMENTS

| | | |
|---|---|---|
| WO | 2006/113585 A2 | 10/2006 |
| WO | 2010/027592 A1 | 3/2010 |

* cited by examiner

DOCKING STATION

PRIORITY

This application claims the benefit under 35 U.S.C. §119 (a) of a Korean patent application filed on Aug. 28, 2012 in the Korean Intellectual Property Office and assigned Serial No. 10-2012-0094161, the entire disclosure of which is hereby incorporated by reference.

BACKGROUND OF THE INVENTION

1. Field of the Invention

The present invention relates to a docking station and an electronic device thereof.

2. Description of the Related Art

The rapid development of the electronic communication industry has led to many advances in electronic devices, in particular, portable terminals. For example, based on the advances in technology, a smart phone, classified as a cellular phone, is now able to provide various advanced features and functions such as web surfing, music listening, movie watching, capturing a video image of a subject, capturing a still image, data communication with another smart phone, etc., in addition to a basic telephony function. Further, new functions are continuously added to address users' demands.

Since electronic devices such as the aforementioned smart phone are designed to be conveniently carried by users in everyday life, an overall volume of the terminal becomes slim while gradually diversifying the aforementioned functions and maintaining high performance.

Further, peripheral devices used together with these electronic devices are also under development. Representative examples thereof may include a Bluetooth device capable of communicating with a peer user or listening to music through near field communication with respect to the electronic device, a removable speaker device selectively connected to the electronic device to amplify an output speaker sound, a mount device for mounting the electronic device thereon, etc.

In particular, the mount device is also called a 'docking station', and is applied to various devices to perform a unique function while mounting the electronic device. In general, the docking station has a mounting groove in a center portion to support the electronic device by partially inserting the electronic device therein. A connector is provided in a protruding manner to a lower portion of the mounting groove to electronically connect a connector port of the electronic device. Therefore, the docking station can be used for various purposes by connecting with the connector. For example, the docking station can charge the electronic device or can interwork with at least one speaker provided together to convert a sound output from the electronic device into a high quality sound.

However, since the conventional docking station is simply designed to expose a device mounting groove including a connector according to a size of an electronic device which is used outside the docking station, there is a problem in that its outer appearance is adversely affected when the docking station is not equipped with the electronic device, and an inner portion of the electronic device is contaminated by entering of external foreign material, which leads to an erroneous operation of the docking station.

To address this problem, a docking body used to mount the device is implemented such that, in case of using the docking body, the docking body itself rotates to expose the device mounting groove for mounting the device, and otherwise, in case of not using the docking body, the docking body is used as a cover.

Such a rotating docking body requires an additional lock hold and release element (e.g., a locking button provided in one side of the docking station) to prevent self rotation when it is pressed by a self-rotation member in a direction for docking the device, and has an inconvenient structure in which the docking body rotates selectively only when the additional lock hold and release element is manipulated by a user.

Accordingly, there is a need for an improved docking station of which a connector and a mounting groove for an electronic device can be selectively disposed therein when the docking station is not in use.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a docking station of which a connector and a mounting groove for an electronic device can be selectively disposed inside thereof when not used, in order to prevent external foreign material from entering therein.

Another aspect of the present invention is to provide a docking station for an electronic device that is capable of conveniently performing a docking operation by exposing a mounting groove for the electronic device with a simple manipulation.

Another aspect of the present invention is to provide a docking station that provides a mounting groove for an electronic device in an exposed manner only when used, so that its outer appearance is aesthetically pleasing during a regular usage.

Another aspect of the present invention is to provide a docking station capable of firmly supporting a mounting groove when an electronic device is mounted on the exposed mounting groove, in order to improve product reliability.

Another aspect of the present invention is to provide a docking station which does not require an additional locking element by automatically holding or releasing a lock on a rotation of a rotator according to a position at which an outer force is applied to a rotatable rotator (i.e., a docking body) including a device mounting groove.

In accordance with an aspect of the present invention, a docking station is provided. The docking station includes a housing having an inner space, a rotator disposed in a rotatable manner inside the housing, and partially exposed outwardly to the housing when completely open, a movable member coupled to the rotator, and exposed together with a device mounting groove for mounting an electronic device thereon when the rotator is completely open, and a stopper coupled to the movable member to selectively control the movable member so that a position of the movable member is fixed when the rotator is completely open and so that the movable member moves in a closing direction together when the rotator is closed.

In the aforementioned aspect of the present invention, the stopper disposed at both lateral sides of the movable member may partially protrude from an elongated hole having a specific length and formed in a direction vertical to a direction in which the electronic device is mounted, and may be disposed such that one end of the elongated hole is pressed by a spring disposed inside the movable member. A second guide slit may be formed in the housing to guide a protruding stopper in the movable member according to an opening/closing operation of the rotator, and an upper end of the second guide slit may have a hanger extended in a parallel direction with respect to the elongated hole so that the stopper is located at the hanger when the rotator is completely open. In this case, the stopper may be pressed by the spring in a direction in which the hanger of the elongated hole is formed.

In addition, a slant cam having a slant portion may be formed at both lateral sides of the rotator to interfere with the stopper when an opening/closing operation is performed. The slant cam may move the stopper in a direction for deviating from the hanger of the housing when the rotator operates in a closing direction.

In addition, the electronic device may be a portable terminal. The docking station may perform at least one of a removable speaker function, a charging function, a data communication function, and the like which operate only by mounting the electronic device thereon.

In accordance with another aspect of the present invention, a docking station is provided. The docking station includes a housing having an inner space, a rotator disposed in a rotatable manner inside the housing, and partially exposed outwardly to the housing when completely open, a movable member coupled to the rotator, and exposed together with a device mounting groove for mounting an electronic device thereon when the rotator is completely open, a stopper disposed in a protruding manner to an elongated hole formed at a lateral side of the movable member and pressed to one side of the elongated hole by an elastic means, a guide slit formed at a lateral side of the housing to guide the stopper according to a rotation of the rotator, a hanger extended in a horizontal direction from an upper portion of the guide slit to prevent the movable member from moving in a direction of mounting the electronic device by allowing the stopper to be caught while being pressed by the elastic means when the rotator is completely open, and a slant cam formed in a slant manner to a lateral side of the rotator to allow the stopper to deviate from the hanger by moving the stopper along a slant portion according to a rotation operation for closing the rotator.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1A:
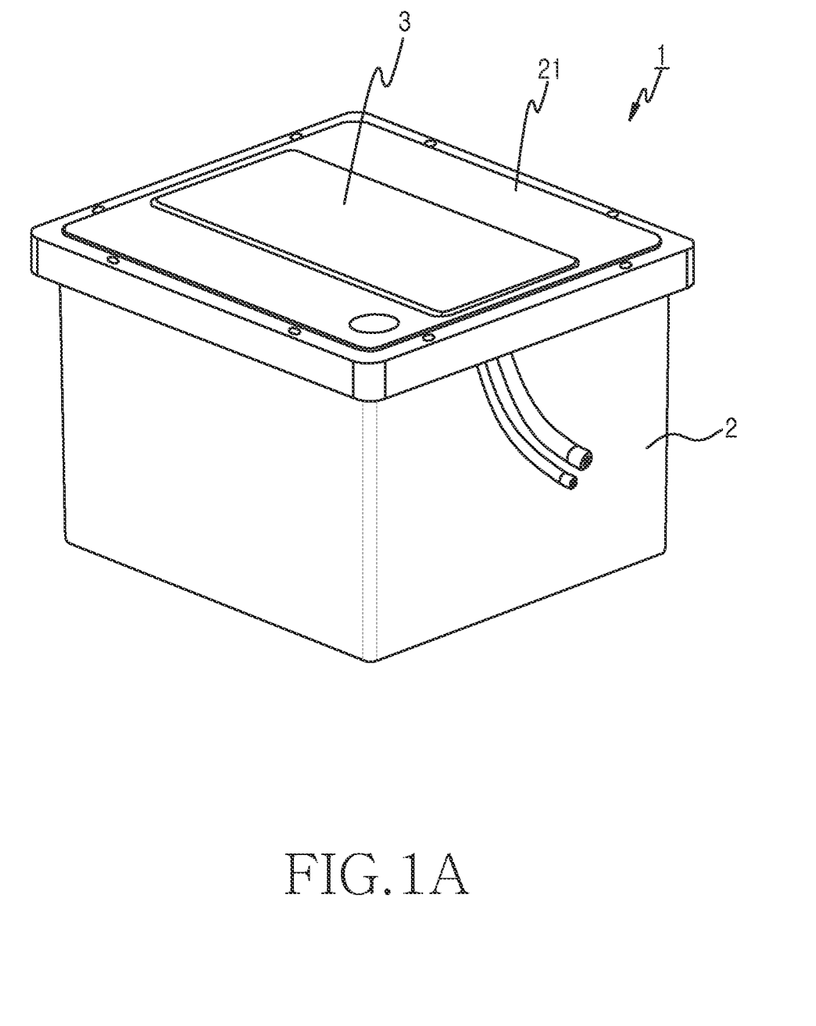
FIG. 1A is a perspective view of an electronic device employing a docking station according to an exemplary embodiment of the present invention.

FIG. 1A is a perspective view of a docking station according to an exemplary embodiment of the present invention.

Referring to FIG. 1A, a docking station 1 includes a housing 2, a cover 21 disposed in an upper portion of the housing 2, and a rotator 3 which is disposed in an opening and closing manner and which rotates by a manipulation of a user.

Although not shown, the rotator 3 maintains the state of FIG. 1A when it is pressed one time by using a well-known locking element. When it is pressed again, the rotator 3 rotates by a specific angle similarly to the state of FIG. 2 and thus is open to be capable of mounting the electronic device.

Figure 1B:
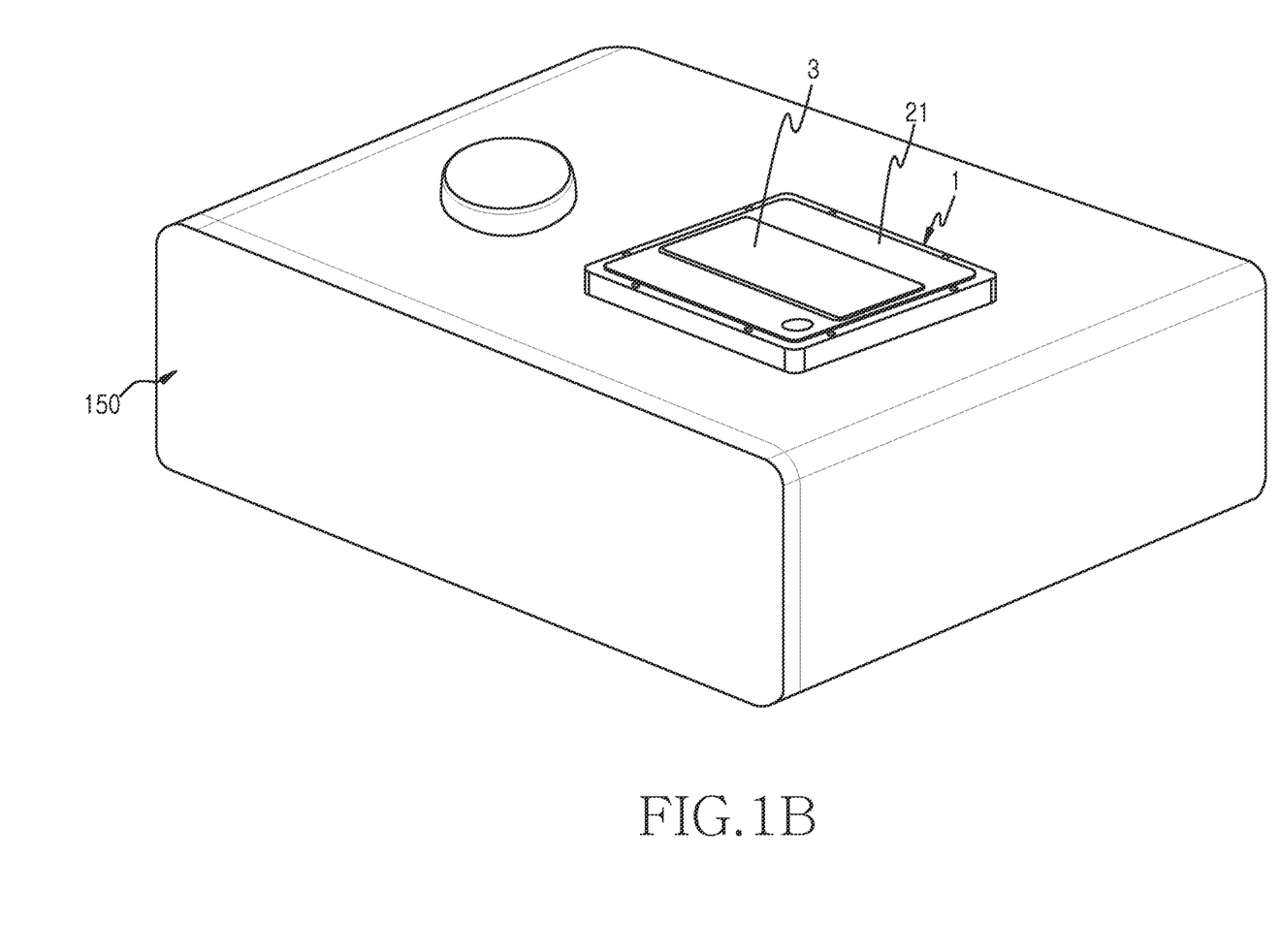
FIG. 1B is a perspective view of a docking station according to an exemplary embodiment of the present invention.

FIG. 1B is a perspective view of an electronic device employing a docking station according to an exemplary embodiment of the present invention.

Referring to FIG. 1B, an electronic device 150 has a cover 21 in an upper portion in an exposable manner. Below the cover 21, a housing can be disposed in an indented manner inside the electronic device 150. Therefore, in this state, by simply pressing a rotator 3 coupled to the cover 21, the rotator 3 rotates to a state of FIG. 2 to be described below, so that an electronic device 100 of FIG. 2 can be mounted.

Herein, the electronic device 150 is applicable to various devices such as a speaker docking station including a removable speaker and capable of vertically mounting the electronic device, a charging device, a data communication device, etc. In addition, the electronic device of the present invention may be applicable to various portable devices including a portable terminal (including a smart phone) illustrated herein.

Figure 2:
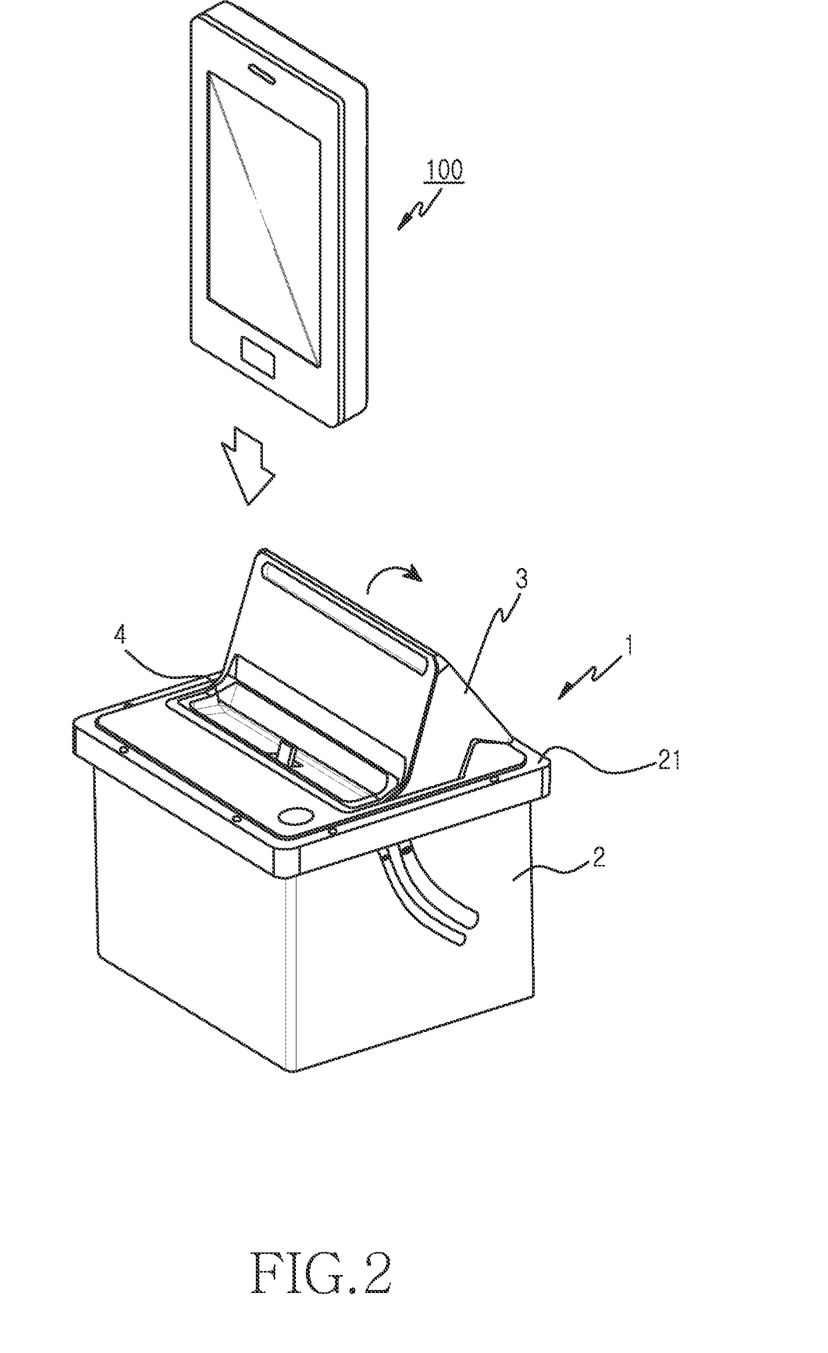
FIG. 2 is a perspective view illustrating a state in which an electronic device is mounted on a docking station of FIG. 1 according to an exemplary embodiment of the present invention.

Accordingly, when the electronic device is not used, the state of FIG. 1B can be maintained, and the user of the docking station 1 can mount an electronic device (see 100 of FIG. 2) in the state of FIG. 2 to simultaneously perform one or more various functions such as a function of outputting a sound to a removable speaker, a function of charging a built-in battery packet, a function of data communication, etc.

Although it is described in the present invention that the cover 21 is disposed in the upper portion of the housing 2 and the rotator 3 is disposed above the cover 21 in a rotatable manner, this is for exemplary purposes only. Therefore, it is also possible to use only a single-type housing 2 in which a rotation space of the rotator 3 is provided in an upper portion thereof without the aforementioned cover 21. This is because the cover 21 is simply for preparing a protruding space of the rotator 3, and all elements for rotating and guiding the rotator 3 in practice and for controlling a movement distance thereof are placed inside the housing 2.

FIG. 2 is a perspective view illustrating a state in which an electronic device is mounted on a docking station of FIG. 1 according to an exemplary embodiment of the present invention.

Referring to FIG. 2, when an upper surface (see 32 of FIG. 3) of a rotator 3 is pressed one time in a state of FIG. 1, the rotator 3 rotates in an arrow direction of FIG. 2 to expose a movable member 4 for receiving an electronic device 100. A device mounting groove (see 41 of FIG. 3) is exposed by the movable member 4. Therefore, a user can perform this function by docking a part of a lower portion of the electronic device 100 into the device mounting groove 41. Accordingly, since a connector 47 is preferably disposed in a protruding manner in the device mounting groove 41, the user can perform an operation of connecting the connector 47 to a connector port disposed in the lower portion of the electronic device with a simple operation of mounting the electronic device 100 on the device mounting groove 41.

In this case, although not shown, corresponding functions can be performed by peripheral devices (not shown) (e.g., a speaker, a data transmission cable, a charging cable, etc.) provided together with the docking station in the electronic device 100.

Meanwhile, after using one or more functions of the electronic device 100, the user detaches the electronic device 100 from the movable body 4 coupled to the rotator 3 of the docking station. Thereafter, when the upper surface 32 of the rotator 3 is pressed to rotate in a direction opposite to the arrow direction of FIG. 2, a closed state is maintained again as shown in the state of FIG. 1. In doing so, when the electronic device 100 is not used, the connector 47 can be disposed inside a housing 2 not only to prevent external foreign material from entering the docking station 1 but also to protect the connector itself. Therefore, with this design, the docking station can be prevented from an erroneous operation and an outer appearance of the docking station can be improved.

Figure 3:
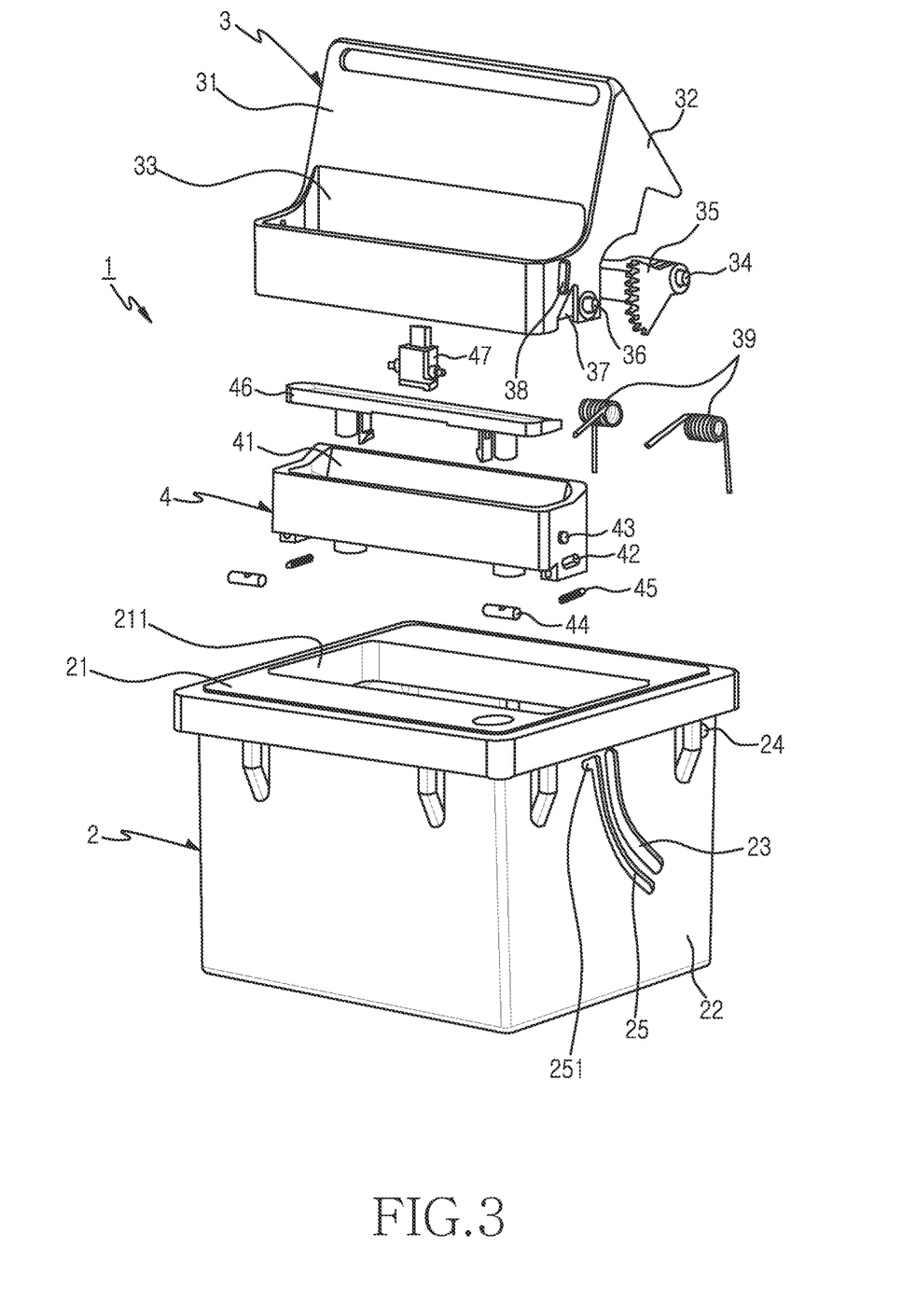
FIG. 3 is an exploded perspective view of a docking station of FIG. 1 according to an exemplary embodiment of the present invention.

FIG. 3 is an exploded perspective view of a docking station of FIG. 1 according to an exemplary embodiment of the present invention.

Referring to FIG. 3, a docking station 1 includes a housing 2, a cover 21 disposed in an upper portion of the housing 2 and including an opening hole 211 having a specific shape, a rotator 3 disposed inside the housing 2 in a rotatable manner and partially exposed outside the housing 2 in a selective manner by a user's manipulation, and a movable member 4 coupled to the rotator 3 and exposed if the rotator 3 is open.

In addition, although it rotates together with the rotator 3, the movable member 4 is disposed such that self-movement is possible in the rotator 3. Thus, the movable member 4 has a structure in which its location is fixed when the electronic device is mounted on a device mounting groove 41 in a state where the rotator 3 is completely open, and it moves inside the housing together only when the rotator rotates to be closed.

The rotator 3 has an upper surface 32 formed in one side of a body 31. A movable member mounting groove 33 is formed in a direction facing the upper surface 32. The movable member mounting groove 33 and the upper surface 32 are formed to have a specific angle. For example, when the rotator 3 is completely open in the housing 2, the movable member mounting groove 33 is formed to be capable of mounting the electronic device for use in a vertical direction. However, the present invention is not limited thereto, and thus this structure can be modified according to an angle of the electronic device to be mounted.

A shaft 34 extended in a widthwise direction is formed below the upper surface 32 of the rotator 3. A rotation gear 35 is formed or coupled to an outer circumferential portion of the shaft 34 so as to rotate together with the shaft 34. The rotation gear 35 is engaged with a damping gear (not shown) formed inside the housing 2 and takes a role of decreasing a rotation speed of the rotator 3.

A guide protrusion 36 which protrudes with a specific length is formed externally at both lateral sides of the movable member mounting groove 33. A slant cam 37 is formed in one side of the guide protrusion 36. The slant cam 37 is formed in a groove manner in the movable member mounting groove 33, and includes a slant portion of which one end and the other end have different heights. An auxiliary guide slit 38 having a shape of an elongated hole is formed at both lateral sides of the movable member mounting groove 33, so as to guide an auxiliary guide protrusion 43 which protrudes at both lateral sides of the movable member 4 to be described below.

A shaft support hole 24, through which both ends of the shaft 34 of the rotator 3 can be inserted, is formed at both lateral sides 22 of the housing 2 so that the rotator 3 can rotate in the housing 2 by the use of the shaft 34. That is, the rotator 3 can rotate about a rotation axis in such a manner that both ends of the shaft 34 are inserted in the shaft support hole 24 formed at the both lateral sides 22 of the housing 2.

At least one torsion spring 39 is coupled to the shaft 34 of the rotator 3. The torsion spring 39 is coupled in such a manner that one end thereof is supported in a direction of rotating the shaft 34 and the other end thereof is supported by the housing 2. Therefore, the rotator 3 is always pressed by the torsion spring 39 so that the rotator 3 rotates in a direction of outwardly opening the rotator 3.

In addition, a first guide slit 23 is formed in a vertical direction at both lateral sides 22 of the housing 2. In an exemplary implementation, the first guide slit 23 is formed in an arc shape of a path which is drawn when rotated about the shaft 34, and the guide protrusion 36 of the rotator 3 can be inserted to guide it. In this case, the first guide slit 23 can be formed with a length capable of determining an opening and closing range of the rotator 3. That is, if the guide protrusion 36 of the rotator 3 is controlled by the uppermost end of the first guide slit 23, a location for the control can be defined as a maximum opening and closing range of the rotator 3. Likewise, if the guide protrusion 36 of the rotator 3 is controlled by the lowermost end of the first guide slit 23, a location for the control can be defined as a closing range of the rotator 3.

In addition, a second guide slit 25 is formed at one side of the first guide slit 23 of the rotator 3 to have the same radius of curvature as the first guide slit 23. The second guide slit 25 guides a stopper 44 disposed in a protruding manner to the movable member 4 to be described below. Unlike the first guide slit 23, the second guide slit 25 further includes a hanger 251 extended in a horizontal direction from an upper portion thereof (i.e., orthogonal to the upper portion). Therefore, as will be described below, in a state where the rotator 3 is completely open, the stopper 44 of the movable member 4 is caught by the hanger 251 so as to prevent the electronic device from moving downwardly when mounted on the device mounting groove 41 of the movable member 4. Further, in a state where the rotator 3 is closed, the stopper 44 can move along the second guide slit 25 together with the rotator 3, and as a result, the movable member 4 can also move together with the rotator 3.

The movable member 4 is formed to have enough space to move itself by being inserted to the movable member mounting groove 33 of the rotator 3. The device mounting groove 41 is formed in an upper portion of the movable member 4 to mount the electronic device thereon. A connector support member 46 in contact with a bottom side of the electronic device is further disposed inside the movable member 4 to support a connector 47. The connector 47 can be coupled to the device mounting groove 41 through the connector support member 46. Although not shown, the connector 47 may be connected by means of a specific electrical connection means (e.g., Flexible Printed Circuit Board (FPCB), session cable, etc.) disposed inside the housing.

An elongated hole 42 is formed at both lateral sides of the movable member 4 in a horizontal direction (i.e., a direction vertical to a direction in which the electronic device is mounted). The stopper 44, disposed with a specific length inside the movable member 4, partially protrudes from the elongated hole 42. The stopper 44 is configured to maintain a state in which it is always pressed in one direction of the elongated hole 42 by the support of a spring 45 disposed inside the movable member 4 in a state of protruding from the elongated hole 42 of the movable member 4. In an exemplary implementation, the stopper 44 is configured to be pressed in a direction in which the hanger 251 of the second guide slit 25 of the housing 2 is formed. In an exemplary implementation, a compressed coil spring is used as the spring 45.

The cover 21 having a rotatable opening hole and from which the rotator 3 protrudes is provided to an upper portion of the housing 2. However, even if the cover 21 does not exist, the present invention can also be implemented only with the housing 2 having a structure in which an opening hole is formed in an upper portion thereof.

Figure 4:
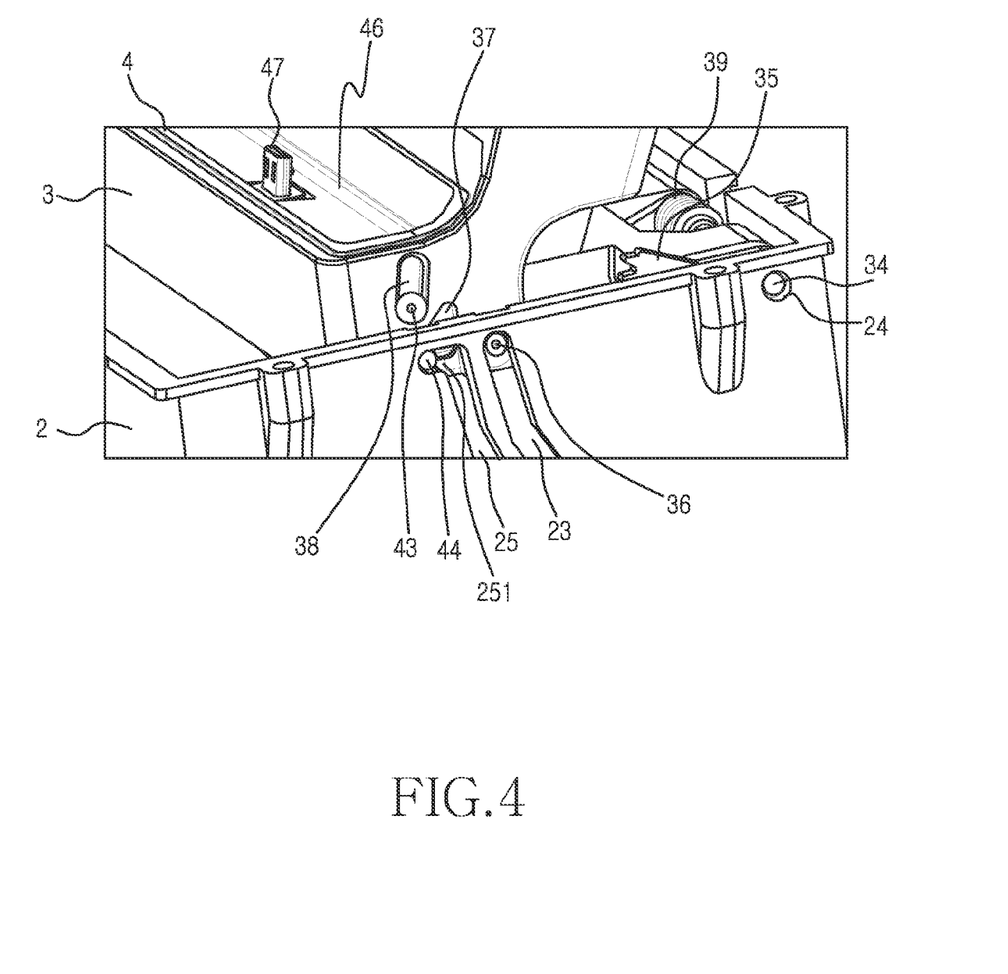
FIG. 4 is an exploded perspective view illustrating a state where a docking station of FIG. 1 is joined according to an exemplary embodiment of the present invention.
Figure 5:
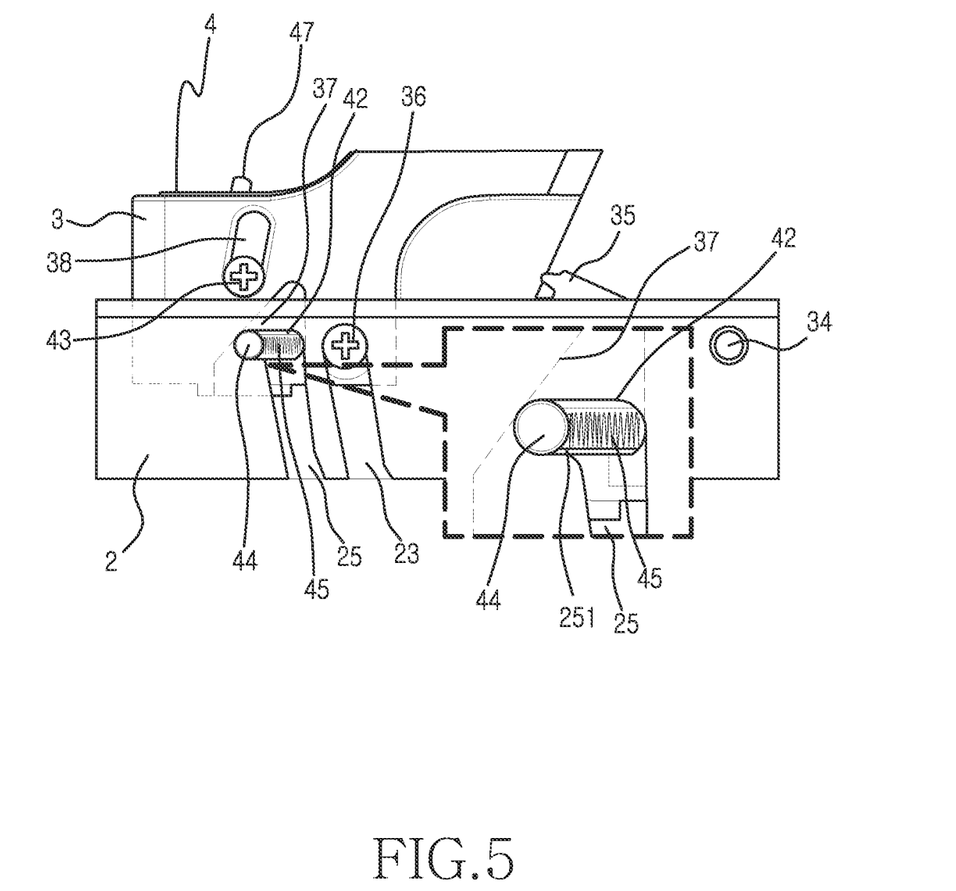
FIG. 5 is a lateral view illustrating a state wherein a docking station of FIG. 1 is joined according to an exemplary embodiment of the present invention.

FIG. 4 is an exploded perspective view illustrating a state where a docking station of FIG. 1 is joined according to an exemplary embodiment of the present invention. FIG. 5 is a lateral view illustrating a state wherein a docking station of FIG. 1 is joined according to an exemplary embodiment of the present invention.

Referring to FIG. 4 and FIG. 5, a rotator 3 is in a state where a shaft 34 is inserted in a shaft support hole 24 of a housing 2 and thus is fixed in a rotatable manner. One end of a torsion spring 39 is pressed to rotate the rotator 3 in an opening direction always by the support of an inner lateral side of the housing 2. In this case, a guide protrusion 36 of the rotator 3 can rotate by the guide of a first guide slit 23 formed with a specific radius of curvature in a vertical direction at a lateral side of the housing 2. When the guide protrusion 36 is controlled by the uppermost end of the first guide slit 23 (in case of FIG. 4 and FIG. 5), the rotator 3 is in a maximum open state in the housing 2.

A stopper 44 which protrudes from an elongated hole 42 formed at both lateral sides of a movable member 4 is disposed in a guidable manner to a second guide slit 25 of the housing 2. Therefore, in a state where the rotator 3 is completely open as illustrated in FIG. 4 and FIG. 5, the stopper 44 is pressed to one side of the elongated hole 42 by a spring 45 disposed inside the movable member 4, and as a result, the stopper 44 is caught by a hanger 251 extended horizontally from the second guide slit 25. Accordingly, even if a force is applied to vertically mount the electronic device on a device mounting groove 41 of the movable member 4, the movable member 4 firmly maintains its position without being moved downwardly from the rotator 3.

In addition, the stopper 44, which protrudes at both lateral sides of the movable member 4, is configured to be controlled within a range in which a slant cam 37 of the rotator 3 can move so that the slant cam 37 interferes with the stopper 44 according to a rotation operation of the rotator 3.

Meanwhile, the movable member 4 is mounted on a movable member mounting groove 33 of the rotator 3. In this case, an auxiliary guide protrusion 43 formed in a protruding manner at both lateral sides of the movable member 4 is inserted to an auxiliary guide slit 38 formed vertically at both lateral sides of the movable member mounting groove 33 of the rotator 3 and thus can perform an auxiliary guide operation with a range of moving inside the movable member mounting groove 33 of the rotator 3.

Although not shown, a well-known locking element is coupled to the rotator 3 and the housing 2. The locking element controls a pressure applied to open the rotator 3 by the use of the torsion spring 39 when the rotator 3 is completely closed in the housing 2 by a user. For example, when the rotator 3 is pressed one time by the user in a closed state, the locking element is released and thus the rotator 3 can be open, and when the rotator 3 is pressed one more time in the closed state, locking can be achieved while maintaining a position thereof.

Although not shown, an additional locking button can be provided to the housing 2 to lock the rotator 3 in a closed state and to open the rotator 3 when pressing the button provided to the housing 2.

Figure 6:
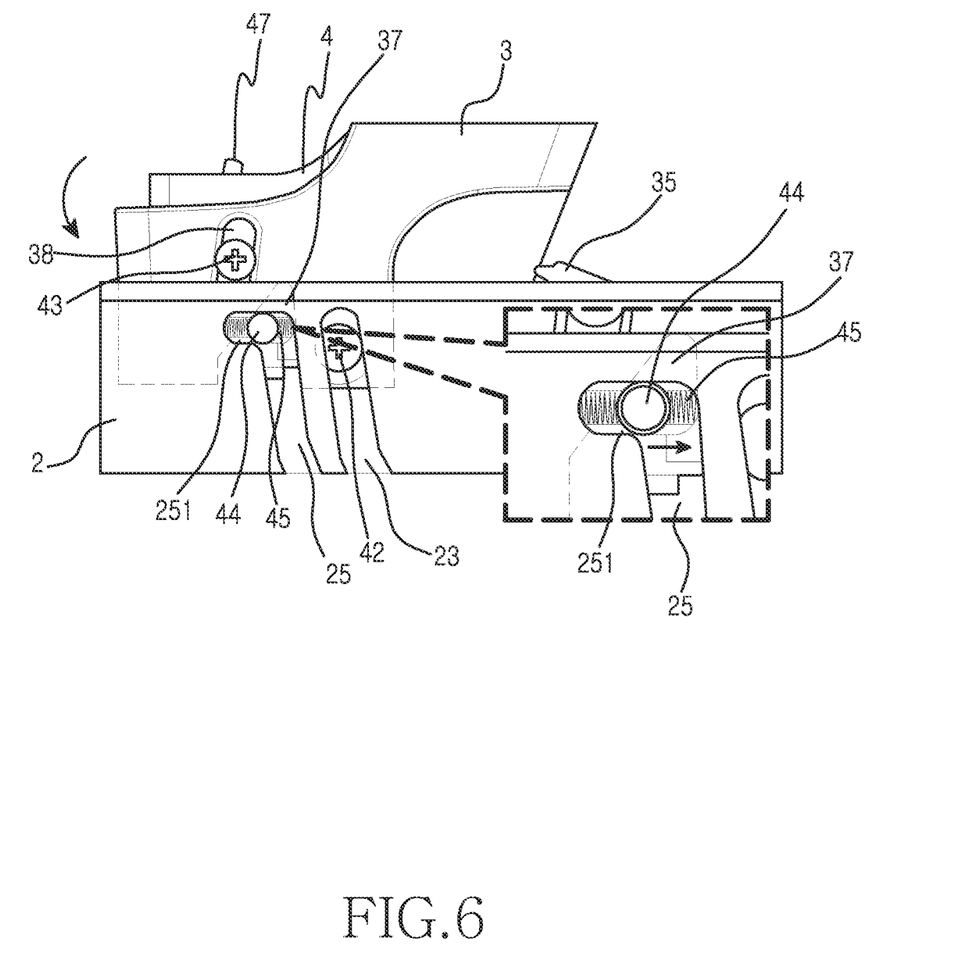
FIG. 6 and FIG. 7 illustrate an operation of a docking station of FIG. 1 according to an exemplary embodiment of the present invention.
Figure 7:
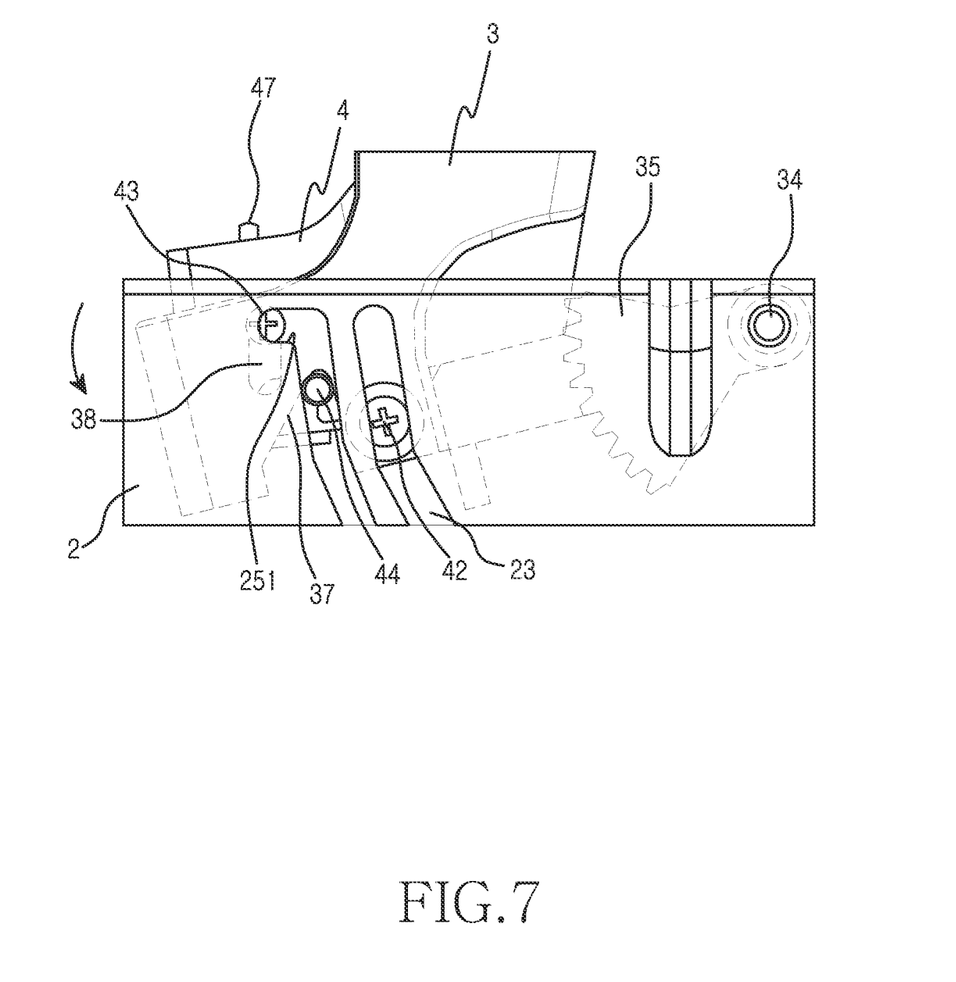

FIG. 6 and FIG. 7 illustrate an operation of a docking station of FIG. 1 according to an exemplary embodiment of the present invention.

Referring back to FIG. 5, the rotator 3 is in a state of being open in the housing 2 to the maximum extent possible. In this case, the rotator 3 is open until the guide protrusion 36 of the rotator 3 is controlled by the uppermost end of the first guide slit 23 of the housing 2. In addition, the stopper 44 which protrudes from the movable member 4 is pressed to be persistently caught by the hanger 251 of the second guide slit 25 of the housing 2, and thus the movable member 4 does not move downwardly even if the electronic device is mounted on the device mounting groove 41 of the movable member 4.

Referring to FIG. 6 and FIG. 7, when a user detaches the electronic device from a docking station 1 and thereafter rotates a rotator 3 to close it, a slant cam 37 of the rotator 3 starts to interfere with a stopper 44 which protrudes from a movable member 4. That is, a slant portion of the slant cam 37 of the rotator 3 allows the stopper 44 to move along the slant portion of the slant cam 37 as the rotator 3 rotates. That is, the stopper 44 persistently pressed by a spring 45 moves to a second guide slit 25 by moving in a direction of deviating from a hanger 251. Thereafter, since the rotator 3 persistently rotates to move the slant cam 37, the stopper 44 enters the second guide slit 25 by passing a boundary portion of the second guide slit 25 and the hanger 251, and the stopper 44 moves downwardly along the second guide slit 25, and as a result, the movable member 4 also moves downwardly along the slant cam 37. That is, if the rotator 3 persistently rotates, the movable member 4 maintains its location due to the stopper 44 and only the rotator 3 rotates by a certain extent. Thereafter, the movable member 4 also rotates together with the rotator 3. Accordingly, it is possible to reach a location at which the rotator 3 is completely closed in a housing 2.

Meanwhile, if the rotator 3 is open from a closed state, the stopper 44 located below the second guide slit 25 moves upwardly along the second guide slit 25. If the rotator 3 rotates further, the stopper 44 is disposed in a location parallel to the hanger 251 extended from the second guide slit 25. In this case, the stopper 44 moves in a direction of the hanger 251 by means of the spring 45 and thus is located as shown in FIG. 3. That is, the stopper 44 prevents the movable member 4 from moving downwardly.

Further, when the rotator 3 is open, an auxiliary guide protrusion 43 which protrudes at both lateral sides of the movable member 4 is guided and raised by an auxiliary guide slit 38 formed at both lateral sides of a movable member mounting groove 33. Therefore, the stopper 44 of the movable member 4 can also be raised along the second guide slit 25 of the housing 2.

The exemplary docking station for an electronic device of the present invention is used by exposing the mounting groove for the electronic device by a simple manipulation only when the docking station is used. Therefore, when the docking station is not used, it is possible to prevent external foreign material from entering the docking station and to improve an outer appearance of the docking station, thereby increasing reliability efficiency.

In addition, since whether to support the mounting groove is determined only by an operation of selectively exposing the mounting groove, an additional support means or locking element for the mounting groove is not necessary.

In addition, since a lock on a rotation of the rotator is automatically held or released according to a location at which an external force is applied to the rotatable rotator including the device mounting groove, an additional locking element is not necessary.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A docking station comprising:
   a housing having an inner space;
   a rotator disposed in a rotatable manner inside the housing, and partially exposed to an outside of the housing when completely open;
   a movable member coupled to the rotator and including a device mounting groove configured to have an electronic device mounted therein when the rotator is completely open, the movable member and the device mounting groove not being exposed to the outside of the housing when the rotator is completely closed, such that the electronic device cannot be mounted therein; and
   a stopper coupled to the movable member to selectively control the movable member so that a position of the movable member is fixed when the rotator is completely open,
   wherein the rotator comprises:
      a body,
      an upper surface formed in a rear direction of the body and at least aligned with a top surface of the housing when the rotator is completely closed, and
      a movable member mounting groove formed in a direction facing the upper surface such that the movable member is disposed within the movable member mounting groove in a movable manner,
   wherein the stopper is disposed at both lateral sides of the movable member and partially protrudes from an elongated hole having a specific length and formed in a direction perpendicular to a direction in which the electronic device is mounted, and
   wherein one end of the elongated hole is pressed by a spring disposed inside the movable member.

2. The docking station of claim 1, wherein the movable member moves in a closing direction together with the rotator when the rotator is closed.

3. The docking station of claim 1,
   wherein the rotator includes a guide protrusion at both lateral sides thereof, and
   wherein the guide protrusion is guided by being inserted into a first guide slit having a specific length and formed at both lateral sides of the housing.

4. The docking station of claim 1, wherein a shaft having a specific length is formed in a protruding manner at both lateral sides of the body, and is inserted in a shaft support hole formed at a lateral side of the housing to guide a rotation operation of the rotator.

5. The docking station of claim 4, wherein a torsion spring is coupled to the housing in such a manner that one end of the torsion spring presses the shaft to rotate the rotator in an opening direction, and another end of the torsion spring is supported by the housing.

6. The docking station of claim 5, wherein the housing further includes a locking element of which a location is fixed when the rotator is completely closed and which opens the rotator only by a user's manipulation.

7. The docking station of claim 5, wherein a rotation gear is coupled to the shaft at least at an angle by which the rotator rotates.

8. The docking station of claim 1,
   wherein a second guide slit is formed in the housing to guide the stopper protruding from the movable member according to an opening/closing operation of the rotator, and
   wherein an upper end of the second guide slit includes a hanger extending in a parallel direction with respect to the elongated hole so that the protruding stopper is located at the hanger when the rotator is completely open.

9. The docking station of claim 8, wherein the stopper is pressed by the spring in a direction in which the hanger of the elongated hole is formed.

10. The docking station of claim 9, wherein a slant cam having a slant portion is formed at both lateral sides of the rotator to interfere with the stopper when the opening/closing operation of the rotator is performed.

11. The docking station of claim 10, wherein the slant cam moves the stopper in a direction for deviating from the hanger of the housing when the rotator operates in a closing direction.

12. The docking station of claim 1, wherein an auxiliary guide protrusion is formed at both lateral sides of the movable member in a protruding manner, and a range of movement of the auxiliary guide protrusion is limited as a result of being coupled to and then guided by an auxiliary guide slit having a specific length and formed in the movable member mounting groove of the rotator.

13. The docking station of claim 1, wherein a connector electrically connected to a connector port of the electronic device is disposed in a protruding manner to the device mounting groove.

14. The docking station of claim 1, wherein the docking station performs at least one of a removable speaker function, a charging function, and a data communication function which operates by mounting the electronic device therein.

15. The docking station of claim 1, wherein the electronic device is a portable terminal.

16. An electronic device comprising a docking station according to claim 1.

17. The electronic device of claim 16, wherein the electronic device is a portable terminal.

18. A docking station comprising:
a housing having an inner space;
a rotator disposed in a rotatable manner inside the housing, and partially exposed to an outside of the housing when completely open;
a movable member coupled to the rotator and including a device mounting groove configured to have an electronic device mounted therein when the rotator is completely open, the movable member and the device mounting groove not being exposed to the outside of the housing when the rotator is completely closed, such that the electronic device cannot be mounted therein;
a stopper disposed in a protruding manner to protrude from an elongated hole formed at a lateral side of the movable member and pressed to one side of the elongated hole by an elastic means;
a guide slit formed at a lateral side of the housing to guide the stopper according to a rotation of the rotator;
a hanger extended in a horizontal direction from an upper portion of the guide slit to prevent the movable member from moving in a direction of mounting the electronic device by allowing the stopper to be caught while being pressed by the elastic means when the rotator is completely open; and
a slant cam formed in a slanting manner to a lateral side of the rotator to allow the stopper to deviate from the hanger by moving the stopper along a slant portion according to a rotation operation for closing the rotator,
wherein the rotator comprises:
a body,
an upper surface formed in a rear direction of the body and at least aligned with a top surface of the housing when the rotator is completely closed, and
a movable member mounting groove formed in a direction facing the upper surface such that the movable member is disposed within the movable member mounting groove in a movable manner,
wherein the stopper is disposed at both lateral sides of the movable member and partially protrudes from an elongated hole having a specific length and formed in a direction perpendicular to a direction in which the electronic device is mounted, and
wherein one end of the elongated hole is pressed by a spring disposed inside the movable member.

* * * * *